(12) United States Patent
Honda

(10) Patent No.: US 7,939,873 B2
(45) Date of Patent: May 10, 2011

(54) CAPACITOR ELEMENT AND SEMICONDUCTOR DEVICE

(75) Inventor: Tatsuya Honda, Kanagawa (JP)

(73) Assignee: Semiconductor Energy laboratory Co., Ltd. (JP)

( * ) Notice: Subject to any disclaimer, the term of this patent is extended or adjusted under 35 U.S.C. 154(b) by 240 days.

(21) Appl. No.: 11/190,769

(22) Filed: Jul. 27, 2005

(65) Prior Publication Data
US 2006/0022246 A1 Feb. 2, 2006

(30) Foreign Application Priority Data

Jul. 30, 2004 (JP) ................................ 2004-224731

(51) Int. Cl.
*H01L 27/108* (2006.01)
(52) U.S. Cl. ................. 257/300; 257/E27.016
(58) Field of Classification Search ........... 257/300, 257/E27.016
See application file for complete search history.

(56) References Cited

U.S. PATENT DOCUMENTS

| | | | |
|---|---|---|---|
| 4,211,941 A | 7/1980 | Schade, Jr. | 307/303 |
| 4,484,076 A | 11/1984 | Thomson | 250/370 |
| 4,547,763 A | 10/1985 | Flamm | 340/347 |
| 4,634,905 A | 1/1987 | Campbell, Jr. | 307/594 |
| 4,935,702 A | 6/1990 | Mead et al. | 330/9 |
| 5,049,758 A | 9/1991 | Mead et al. | 307/246 |
| 5,068,622 A | 11/1991 | Mead et al. | 330/253 |
| 5,160,899 A | 11/1992 | Anderson et al. | 330/288 |
| 5,278,428 A | 1/1994 | Yamada et al. | 257/66 |
| 5,650,636 A | 7/1997 | Takemura et al. | 257/59 |
| 5,962,872 A | 10/1999 | Zhang et al. | |
| 6,048,738 A | 4/2000 | Hsu et al. | 438/3 |
| 6,184,726 B1 | 2/2001 | Haeberli et al. | 327/96 |
| 6,414,345 B1 * | 7/2002 | Suzawa | 257/296 |
| 6,531,380 B2 * | 3/2003 | Li et al. | 438/579 |
| 6,649,963 B1 | 11/2003 | Hsu et al. | 257/300 |
| 6,867,431 B2 | 3/2005 | Konuma et al. | |
| 6,977,392 B2 | 12/2005 | Yamazaki et al. | |

FOREIGN PATENT DOCUMENTS

| | | |
|---|---|---|
| EP | 0 464 664 A2 | 1/1992 |
| JP | 04-111471 | 4/1992 |
| JP | 04-111472 | 4/1992 |

* cited by examiner

*Primary Examiner* — Bradley K Smith
*Assistant Examiner* — Amar Movva
(74) *Attorney, Agent, or Firm* — Husch Blackwell LLP (57) ABSTRACT

An object of the present invention is that the capacitance of MOS capacitors is changed without varying the kind of an impurity (a donor or an acceptor) in a channel formation region, and an n-type MOS capacitor and a p-type MOS capacitor are formed over a same substrate. By changing the offset length between a contact region and a channel formation region, the capacitance of a MOS capacitor can be changed without increasing the number of manufacturing process. Also, an n-type MOS capacitor and a p-type MOS capacitor can be formed over a same substrate only by changing the offset length. In addition, an n-type MOS capacitor and a p-type MOS capacitor can be formed over a same substrate by changing the dose amount of impurity with respect to a channel formation region while fixing the offset length.

23 Claims, 13 Drawing Sheets

Vg = 0 (thermal equilibrium state)

FIG. 5C

FIG. 6A $V_g = 0$ (thermal equilibrium state)

FIG. 6B $V_g < V_{fb}$ (accumulation state)

CAPACITOR ELEMENT AND SEMICONDUCTOR DEVICE

BACKGROUND OF THE INVENTION

1. Field of the Invention

The present invention relates to a capacitor element using a semiconductor, for example, a MOS capacitor. Also, the present invention relates to a memory element using such a MOS capacitor, for example, a MOS memory. Furthermore, the invention relates to a semiconductor device including such a capacitor element and a memory element.

2. Description of the Related Art

In recent years, semiconductor devices have been outstandingly developed. In accordance with the development of highly-integrated, high-density semiconductor devices, the miniaturization of each element pattern that is formed therein has been rapidly carried out. High speed, small, high-capacity semiconductor devices have been required insistently. In order to realize the high speed, small, high-capacity semiconductor devices, each element pattern included therein has been necessary to be miniaturized increasingly.

In particular, a memory element is a representative example of such elements. It is necessary to reduce not only the sizes of respective elements such as a transistor and a capacitor but also the size of a memory including these elements to reduce an occupation area thereof. In order to realize the reduction in occupation area, various kinds of structures have been developed actively (e.g., the patent document 1 and the patent document 2).

[Patent Document 1]: Japanese Patent No. 2979098
[Patent Document 2]: Japanese Patent No. 3182758

In order to form MOS capacitors having different capacitance as storage capacitor elements of a memory and a panel by using the conventional technique, the electrode area is necessary to be changed for each MOS capacitor. Therefore, there has been a problem in which the number of manufacturing process is increased.

Also, in order to hold negative and positive potentials, an n-type MOS capacitor and a p-type MOS capacitor have been necessary to be formed separately as the storage capacitor elements such as the memory and the panel.

Accordingly, with respect to a memory, a panel or the like that requires MOS capacitors having different amounts of capacitance over one substrate, or a memory, a panel or the like that requires both an n-type MOS capacitor and a p-type MOS capacitor, the number of manufacturing process is increased, and therefore, the throughput is reduced.

SUMMARY OF THE INVENTION

It is an object of the present invention to provide capacitor elements having different characteristics without increasing the number of manufacturing process.

According to the present invention, the capacitance of a MOS capacitor can be significantly changed only by changing a distance of an edge of a gate electrode to a boundary between a contact region and a channel formation region (hereinafter referred to as an "offset length") as compared with the case of changing the electrode area. Therefore, MOS capacitors having various amounts of capacitance can be manufactured over a substrate only by changing the offset length.

In the present invention, an n-type MOS capacitor and a p-type MOS capacitor can be formed over a same substrate by changing an offset length.

In addition, according to the present invention, an n-type MOS capacitor and a p-type MOS capacitor can be formed over a same substrate by changing the concentration of an impurity in a channel formation region while fixing the offset length.

In an aspect of the invention, a capacitor element includes: a channel formation region and a contact region in a semiconductor layer; a gate insulating film on the channel formation region; a gate electrode on the gate insulating film; and a contact electrode on the contact region, wherein the concentration of an impurity included in the contact region is higher than that in the channel formation region, and there is a distance of the edge of the gate electrode to a boundary between the contact region and the channel formation region.

In another aspect of the invention, a semiconductor device includes a plurality of capacitor elements, and each of the plurality of capacitor elements includes: a channel formation region and a contact region in a semiconductor layer; a gate insulating film on the channel formation region; a gate electrode on the gate insulating film; and a contact electrode on the contact region, wherein the concentration of an impurity included in the contact region is higher than that in the channel formation region, and a distance of the edge of the gate electrode to a boundary between the contact region and the channel formation region is different in each of the plurality of capacitor elements.

In another aspect of the invention, a semiconductor device includes a plurality of capacitor elements, and each of the plurality of capacitor elements includes: a channel formation region and a contact region in a semiconductor layer; a gate insulating film on the channel formation region; a gate electrode on the gate insulating film; and a contact electrode on the contact region, wherein the concentration of an impurity included in the contact region is higher than that in the channel formation region, a distance of the edge of the gate electrode to a boundary between the contact region and the channel formation region is different in each of the plurality of capacitor elements, and the plurality of capacitor elements have different polarities from one another.

In the present invention, the contact region has an opposite conductivity type from that of the channel formation region.

In the present invention, the contact region has a same conductivity type as that of the channel formation region.

In accordance with the present invention, even in a panel which utilizes MOS capacitors of only one of n-type or p-type as a conductivity type of channel forming regions, both of a positive potential and a negative potential can be retained.

DESCRIPTION OF THE PREFERRED EMBODIMENTS

In the present embodiment mode, an example of manufacturing MOS capacitors will be described as an example of MOS capacitor elements with reference to FIGS. 1A and 1B, FIGS. 2A and 2B, FIGS. 3A and 3B, FIG. 4, FIGS. 5A to 5C and FIGS. 6A and 6B.

Figure 1A:
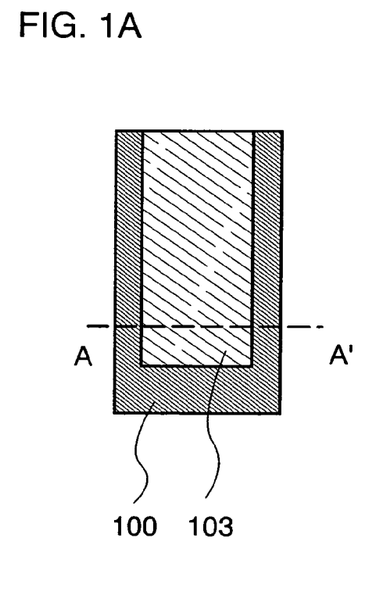
FIG. 1A is a top view and FIG. 1B is a cross sectional view showing a MOS capacitor element according to the present invention.
Figure 1B:
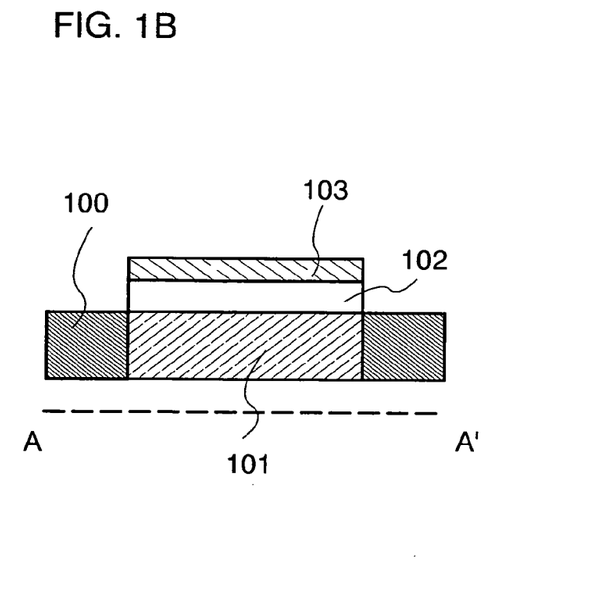
Figure 2A:
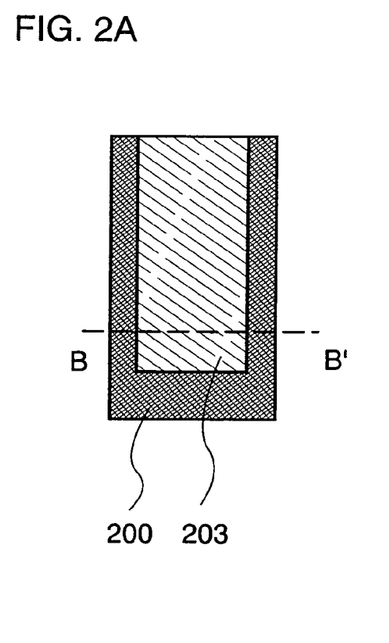
FIG. 2A is a top view and FIG. 2B is a cross sectional view showing a MOS capacitor element according to the invention.
Figure 2B:
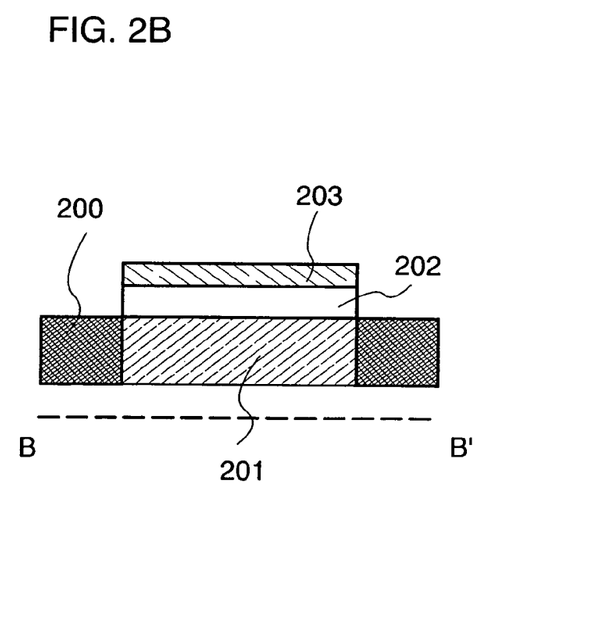

FIGS. 1A and 1B and FIGS. 2A and 2B show structures of MOS capacitor elements according to the present embodiment mode. Each MOS capacitor element as shown in FIGS. 1A and 1B and FIGS. 2A and 2B has a structure in which an insulating film is formed on a semiconductor film and a gate electrode is further formed thereon. The conductivity types of junction portions (contact regions) where are connecting to ground in measuring the capacitance are different from each other in FIGS. 1A and 1B and FIGS. 2A and 2B. In FIGS. 1A and 1B, the contact region is doped with a high concentration of donors and has an n-type conductivity. In FIGS. 2A and 2B, the contact region is doped with a high concentration of acceptors and has a p-type conductivity. Other parts of the both MOS capacitor elements as shown in FIGS. 1A and 1B and FIGS. 2A and 2B are identical to one another.

FIG. 1B and FIG. 2B are cross sectional views along a dashed line A-A' and a dashed line B-B', respectively. The cross sectional structures as shown in FIG. 1B and FIG. 2B are equivalent to a single drain structure of a transistor having no offset between a channel formation region and a source or drain region. Hereinafter, the capacitor element having the structure as shown in FIGS. 1A and 1B is referred to as an $n^+$ contact MOS capacitor whereas the capacitor element having the structure as shown in FIGS. 2A and 2B is referred to as a $p^+$ contact MOS capacitor in the present specification. In a capacitor element according to the present invention, a region in a semiconductor layer that corresponds to a source region or a drain region of a transistor is referred to as a contact region while a lower portion of a gate electrode in the semiconductor layer is referred to as a channel formation region in this specification.

Next, results of measuring the capacitance of a capacitor element will be shown. The dimensions of a MOS capacitor element used in this measurement are shown in FIGS. 3A and 3B.

Figure 3A:
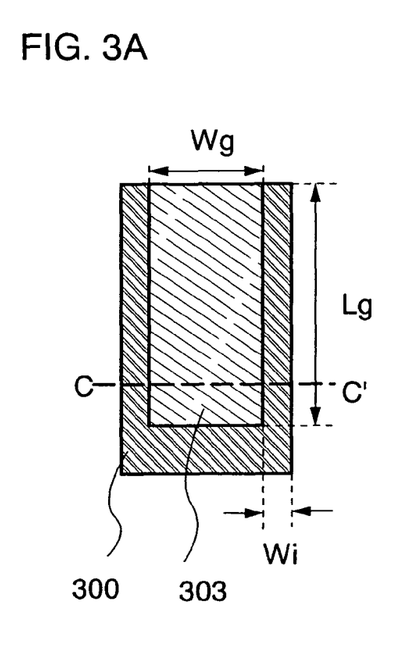
FIG. 3A is a top view and FIG. 3B is a cross sectional view showing a MOS capacitor element according to the invention.
Figure 3B:
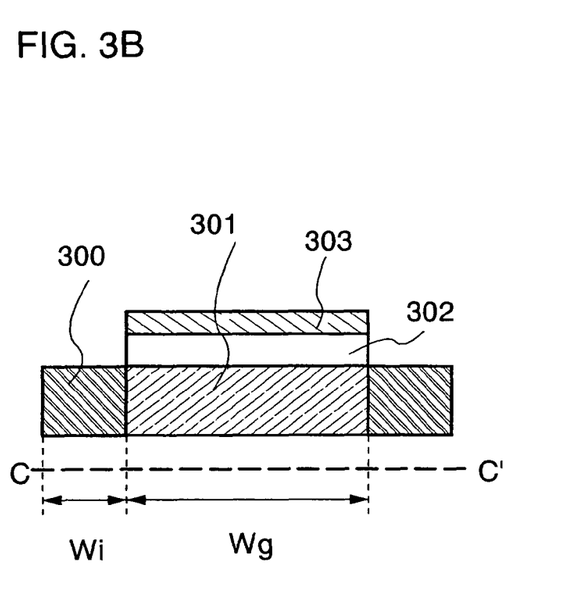

In FIGS. 3A and 3B, reference numeral 300 denotes an impurity region (a contact region); 301, a channel formation region; 302, a gate insulating film; and 303, a gate electrode. The width Wg of the gate electrode 303 is 40 μm and the length Lg of thereof is 2,000 μm. The width Wi of the contact region is 40 μm.

The capacitor elements according to the present embodiment mode is manufactured as follows. At first, an insulating film is formed over a glass substrate as a base film. In this embodiment mode, a silicon oxide film (an $SiO_2$ film) is formed to have a thickness of 150 nm as the insulating film.

Of course, the insulating film is not limited to the above described material. For example, a single layer film of a silicon oxide film, a silicon nitride film, a silicon oxide film containing nitrogen, a silicon nitride film containing oxygen and the like, or a multilayer film including these films can be used as the insulating film.

A semiconductor film is next formed on the base film. As the semiconductor film, a simple substrate such as silicon (Si) and germanium (Ge), a compound semiconductor such as GaAs, InP, SiC, ZnSe and GaN, and a semiconductor such as SiGe and $Al_xGaAs_{1-x}$ can be used. In this embodiment mode, an amorphous silicon film (a-Si film) is formed to have a thickness of 54 nm.

Subsequently, a catalytic element promoting crystallization of the semiconductor film, e.g., nickel (Ni) is added to the a-Si film. The a-Si film is then crystallized by a heat treatment or laser irradiation to form a crystalline semiconductor film.

Of course, the semiconductor film is not limited to the crystalline semiconductor film formed by the above described method. Alternatively, a polycrystalline semiconductor film formed over a substrate having an insulated surface may be used as the semiconductor film. Also, a semiconductor substrate may be used.

Next, a p-type impurity is introduced into the crystalline semiconductor film. In this embodiment mode, boron of $2 \times 10^{13}$ cm$^{-2}$ is introduced into the crystalline semiconductor film. According to this process, channel formation regions 101 and 201 are formed, respectively.

Thus-manufactured crystalline semiconductor films are patterned to form island-like semiconductor films such that they have the dimensions as shown in FIGS. 3A and 3B. As gate insulating films 102 and 202, for example, silicon oxide films ($SiO_2$ films) are formed on the respective island-like semiconductor films. A single layer film of a silicon oxide film, a silicon nitride film, a silicon oxide film containing nitrogen, a silicon nitride film containing oxygen or the like, or a multilayer film including these films can be used as the gate insulating film 102 and the gate insulating film 202.

Next, conductive films, e.g., laminated films including tantalum nitride films (TaN films) and tungsten films (W films) are formed on the gate insulating films 102 and 202. The laminated films including the TaN films and the W films are patterned by dry etching to form a gate electrode 103 and a gate electrode 203. Further, a single layer film of a polycrystalline silicon film (poly-Si), tungsten (W), aluminum (Al), titanium (Ti), tantalum (Ta) or the like, or a multilayer film including these films may be used as the conductive films.

An n-type impurity or a p-type impurity is introduced into the island-like semiconductor films to form an n-type high concentration impurity region and a p-type high concentration impurity region. In the case of forming the n-type high concentration impurity region, an impurity serving as a donor such as phosphorus (P), arsenic (As) and antimony (Sb) is introduced into the island-like semiconductor film. In the case of forming the p-type high concentration impurity region, an impurity serving as an acceptor such as boron (B), tin (Sn) and aluminum (Al) is introduced into the island-like semiconductor film.

In this embodiment mode, for example, phosphorus of $5 \times 10^{14}$ cm$^{-2}$ is introduced into the island-like semiconductor film to form the n-type high concentration impurity region 100 (hereinafter, referred to as the "$n^+$ contact region" in the present specification), while boron of $2 \times 10^{14}$ cm$^{-2}$ is introduced into the island-like semiconductor film to form the p-type high concentration impurity region 200 (hereinafter, referred to as the "p+ contact region" in this specification). These impurities are then activated by heat treatment, laser irradiation, or the like. In this embodiment mode, these impurities are activated by irradiating a YAG laser.

According to the above described process, the MOS capacitor elements are manufactured (see FIGS. 1A and 1B and FIGS. 2A and 2B).

The overall capacitance of each MOS capacitor element manufactured above is obtained by combining the capacitance of the gate insulating film, the capacitance of a depletion layer formed in the channel formation region and the capacitance of the junction formed between the channel formation region and the contact region. This is hereinafter referred to as combined capacitance.

Figure 4:
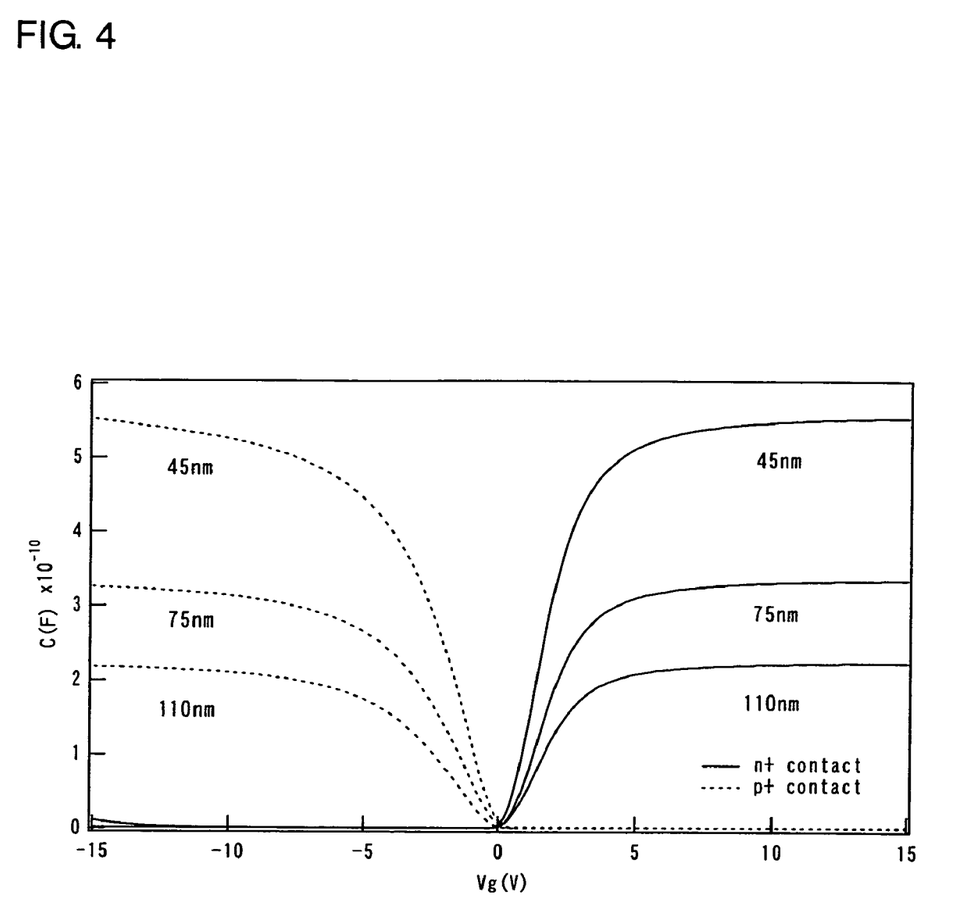
FIG. 4 is a graph showing CV curves of a MOS capacitor element according to the invention.

FIG. 4 shows results of CV measurements of these two kinds of (n+ contact and p+ contact) capacitor elements. The horizontal axis represents the gate voltage whereas the longitudinal axis represents the capacitance. Further, in FIG. 4, the capacitance is measured by using MOS capacitor elements in which the thicknesses of the gate insulating films 102 and 202 are set to be 45 nm, 75 nm and 110 nm, respectively.

According to FIG. 4, although the channel formation regions 101 and 201 just below the respective gate electrodes 103 and 203 have both the p-type conductivity, the p+ contact MOS capacitors show the CV curves of a p-type MOS whereas the n+ contact MOS capacitors show the CV curves of an n-type MOS. Further, these tendencies are independent of the thicknesses of the respective gate insulating films.

Figure 5A:
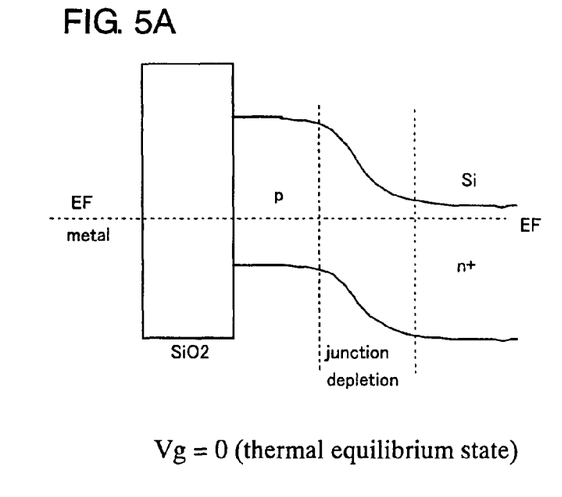
FIGS. 5A to 5C are diagrams explaining a phenomenon shown in the CV curve according to the invention.

The phenomenon as shown in the CV curves of FIG. 4 can be described as follows. FIG. 5A shows a thermal equilibrium state of the n+ contact MOS capacitor. Further, it is assumed that there is no difference in work function between the island-like semiconductor film and the gate electrode 103 for the sake of convenience.

Figure 5B:
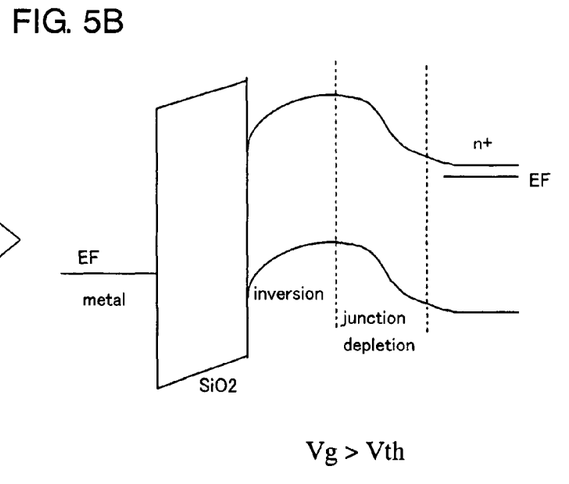

When applying the gate voltage Vg that is larger than the threshold voltage Vth to the n+ contact MOS capacitor in the thermal equilibrium state as shown in FIG. 5A, the p-type channel formation region 101 becomes in a weakly-inverted state as shown in FIG. 5B, and then electrons are induced in an interface between the gate insulating film 102 and the island-like semiconductor film.

Figure 5C:
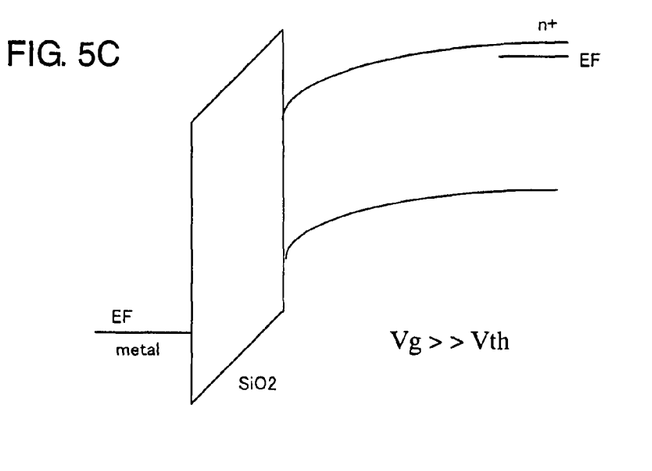

When the gate voltage is further increased positively, the p-type channel formation region 101 becomes in a strongly-inverted state so that the density of electrons in the interface between the gate insulating film 102 and the island-like semiconductor film is increased sufficiently. When the carrier density of the p-type channel formation region 101 becomes equivalent to that of the n+ contact region 100, the holes are induced in the energy band as shown in FIG. 5C. Under this accumulation condition, the overall combined capacitance is equal to the electric capacitance of the insulating film.

Figure 6A:
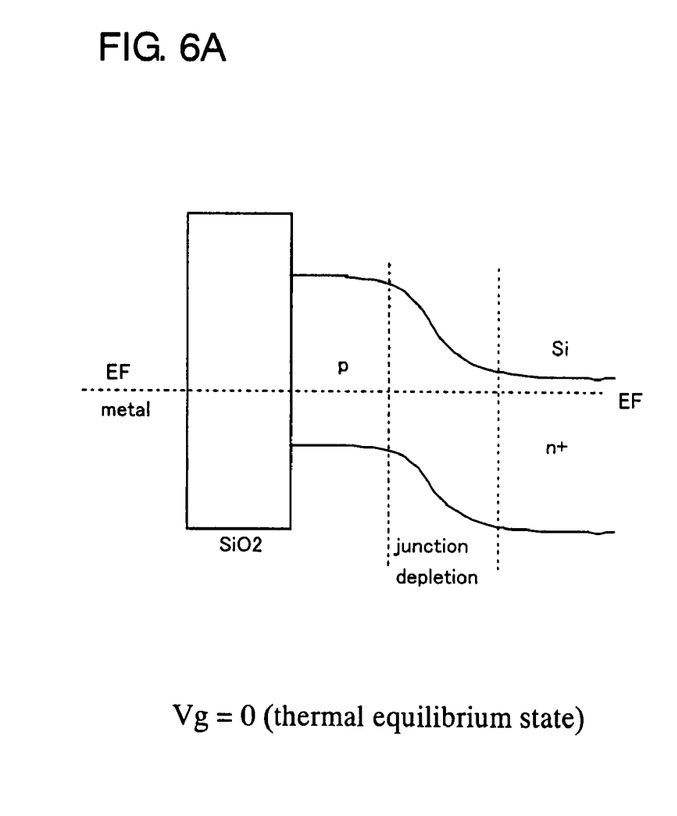
FIGS. 6A and 6B are diagrams explaining a phenomenon shown in the CV curve according to the invention.
Figure 6B:
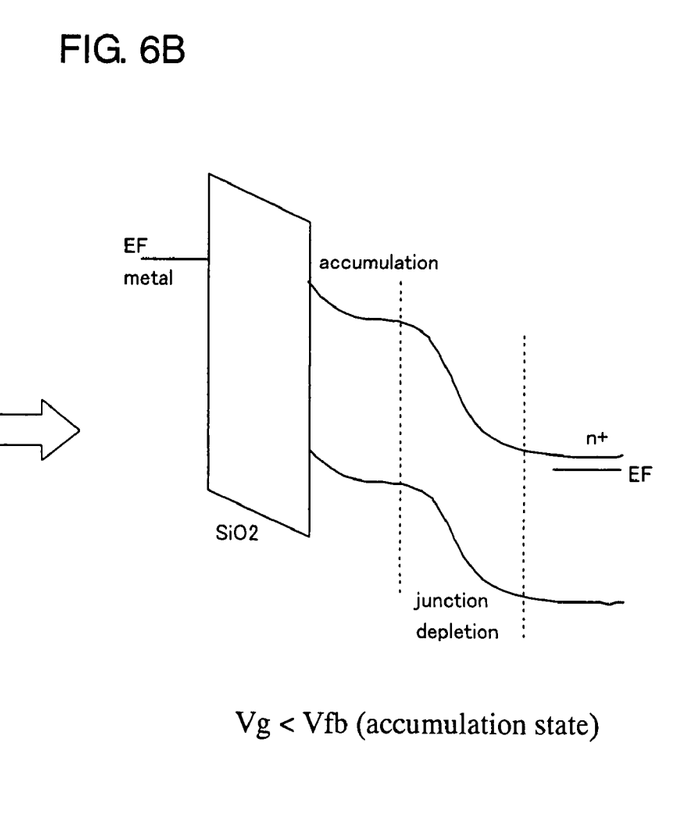

Meanwhile, as shown in FIGS. 6A and 6B, when applying the voltage that is lower than the flat band voltage Vfb to the gate electrode 103 of the n+ contact MOS capacitor in the thermal equilibrium state, the p-type channel formation region 101 becomes in an accumulation state, and therefore, a depletion layer caused between the p-type channel formation region 101 and the n+ contact region 100 is expanded. Consequently, the overall combined capacitance is reduced as compared with the electric capacitance of the insulating film.

Accordingly, it is known that when the gate voltage is positively increased, the overall combined capacitance approaches the capacitance of the insulating film whereas when the gate voltage is negatively increased, the overall combined capacitance approaches 0. This gate voltage dependency of the capacitance corresponds to the behavior of the n-type MOS capacitor. That is, the MOS capacitor element having the p-type channel formation region behaves similarly to the case of having an n-type channel formation region, regardless of the conductivity type of its channel formation region.

Since there is no offset between the channel formation region 101 just below the gate electrode 103 and the contact region 100, a depletion layer or an accumulation layer just below the gate electrode 103 is expanded to the contact region 100, and hence, the above described change in capacitance is caused.

Therefore, the CV curve corresponding to the conductivity type of the channel formation region 101 just below the gate electrode 103 can be obtained by expanding this offset such that a depletion layer or an accumulation layer just below the gate electrode 103 does not expand to the contact region 100.

The MOS capacitor element according to the present invention can be applied to a memory element, e.g., a semiconductor device including a MOS memory or a memory element.

Embodiment 1

Figure 7A:
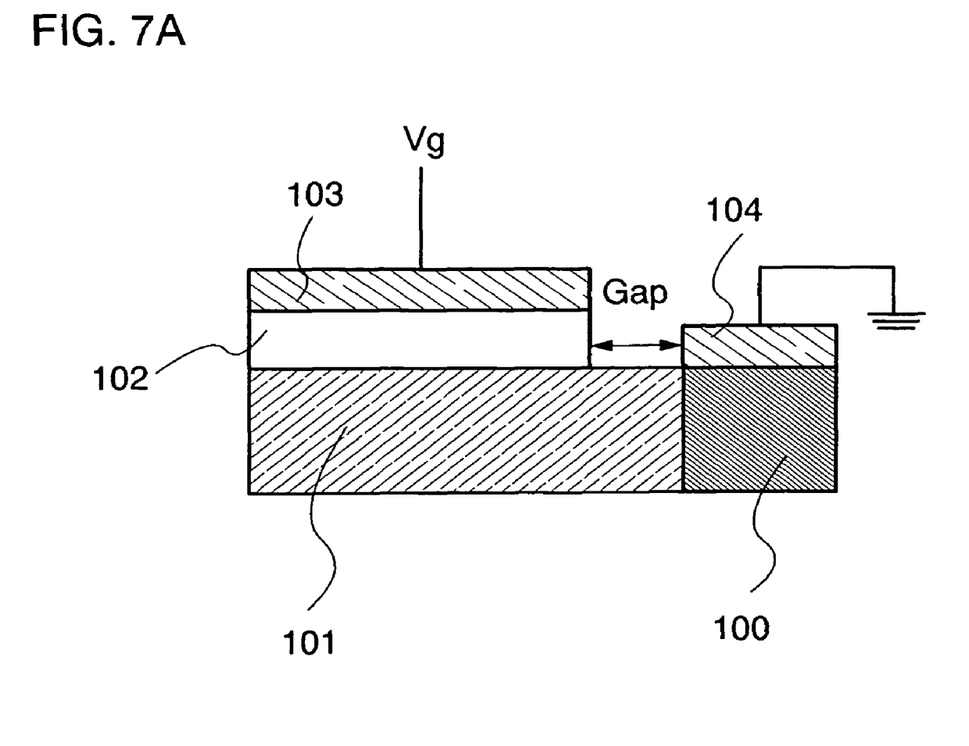
FIG. 7A is a cross sectional view and FIG. 7B is a top view showing a MOS capacitor element according to the invention.
Figure 7B:
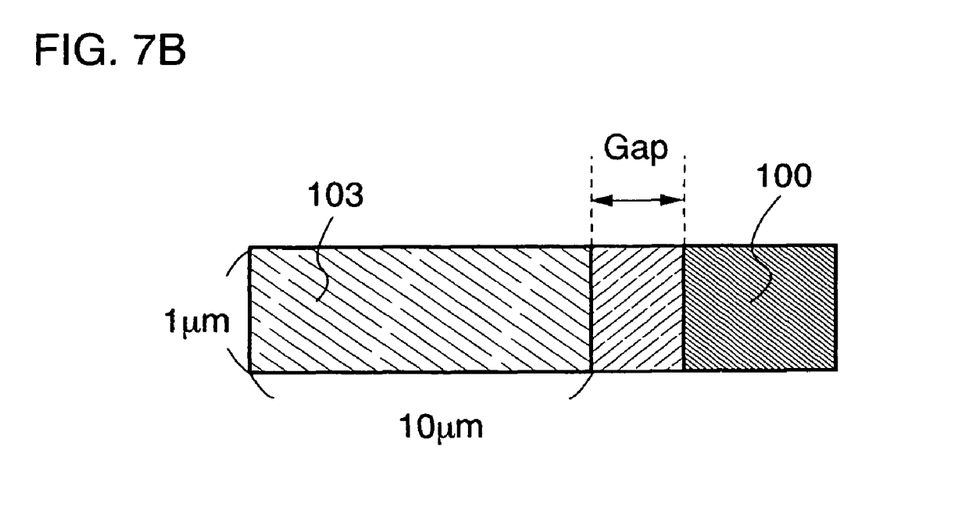
Figure 8:
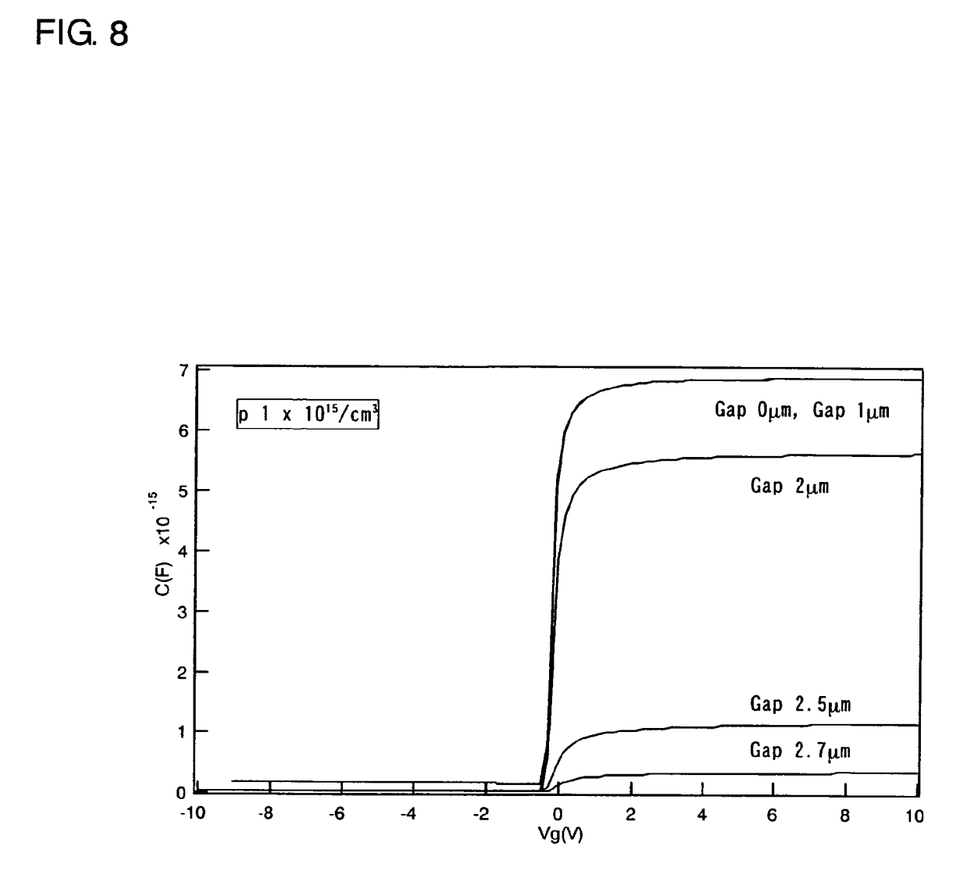
FIG. 8 is a graph showing the dependency of offset length (Gap) of a MOS capacitor according to the invention.
Figure 9:
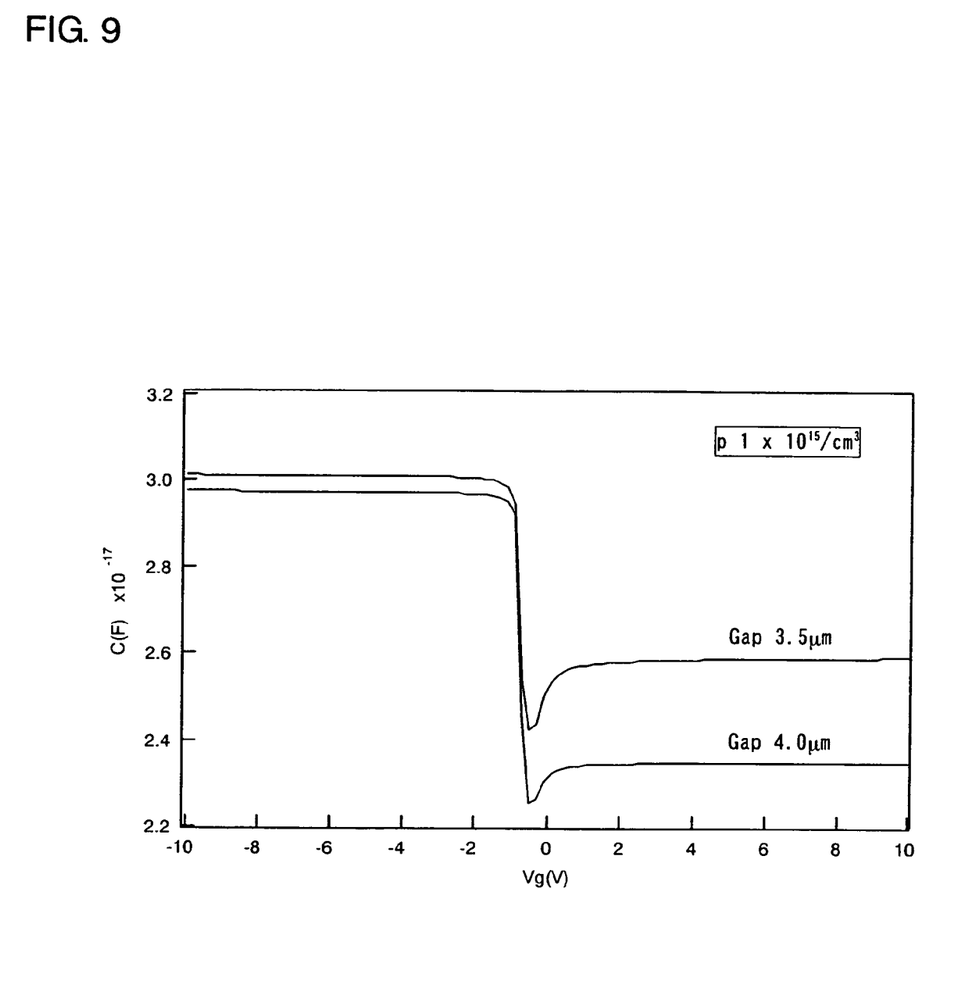
FIG. 9 is a graph showing the dependency of offset length (Gap) of a MOS capacitor according to the invention.

A simulation test of the offset length (Gap) dependency in CV curves was performed using a MOS capacitor having a structure as shown in FIG. 7A. FIG. 7B is a top view of FIG. 7A. The simulation results are shown in FIG. 8 and FIG. 9.

In the present embodiment, portions identical to those of the embodiment mode were denoted by same reference numerals. The offset length (Gap) represents a length of the edge of the gate electrode 103 to a boundary between the impurity region (contact region) 100 and the channel formation region 101. The contact electrode 104 was formed on the contact region 100 and was connected to ground potential. Also, the gate electrode 103 was applied with the gate voltage Vg.

The film thicknesses and length of the various portions, the concentrations of impurities, and the like were set as follows.

Thickness of the gate insulating film (e.g., a silicon oxide film): 50 nm

Thickness of an island-like semiconductor (e.g., a silicon film): 50 nm

Gate contact area: 10×1 μm² (see FIG. 7B)

Impurity of the contact region and its concentration: phosphorus, $1 \times 10^{19}$ cm$^{-3}$ Impurity of the channel formation region and its concentration: boron, $1 \times 10^{15}$ cm$^{-3}$ As the physical model, an avalanche, a recombination, a tunneling current (Fowler Nordheim) and a high electric field saturated model were used.

Also, TCAD GENESISe 7.0 CAD manufactured by ISE Corporation was used as calculation software.

FIG. 8 and FIG. 9 show the offset length dependencies of the capacitance obtained by the simulation. FIG. 8 shows the offset length dependencies in the case where the offset length is set to be 0 μm, 1 μm, 2 μm, 2.5 μm, and 2.7 μm, respectively. Also, FIG. 9 shows the offset length dependencies in the case where the offset length is set to be 3.5 μm and 4.0 μm, respectively.

According to FIG. 8 and FIG. 9, there is almost no difference in the offset length dependencies between the case of the 0 μm offset length and the case of 1.0 μm offset length. However, it is known that the longer the offset length is, the lower the capacitance is.

As shown in FIG. 8 and FIG. 9, the capacitance ratio of an inverted region (Vg<0) to an accumulation region (Vg>0) is reduced with increasing the offset length. As shown in FIG.

Figure 10:
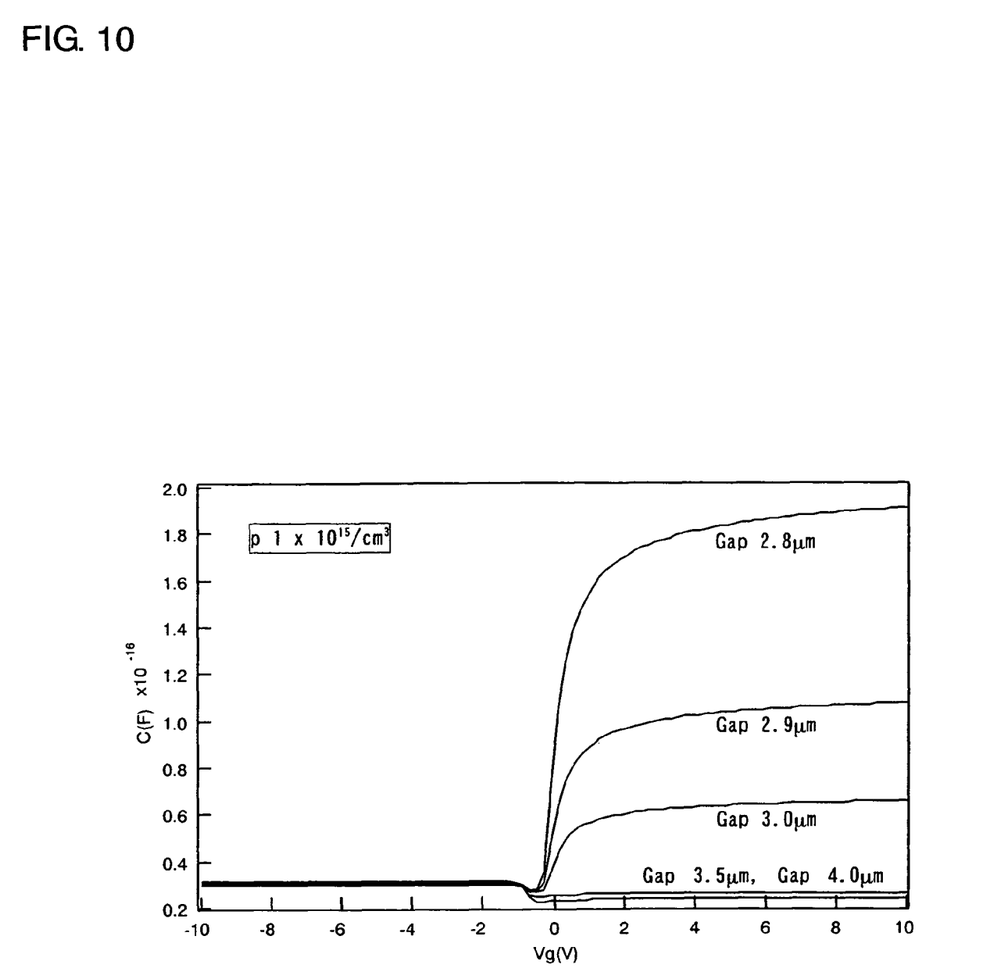
FIG. 10 is a graph showing the dependency of offset length (Gap) of a MOS capacitor according to the invention.

10, when the offset length is set to be a certain level (when the offset length is set to be 3.5 μm in FIG. 10), the amount of capacitance in the inverted region and the amount of capacitance in the accumulation region are inverted so that a CV curve of a p-type MOS capacitor element is shown.

Figure 14:
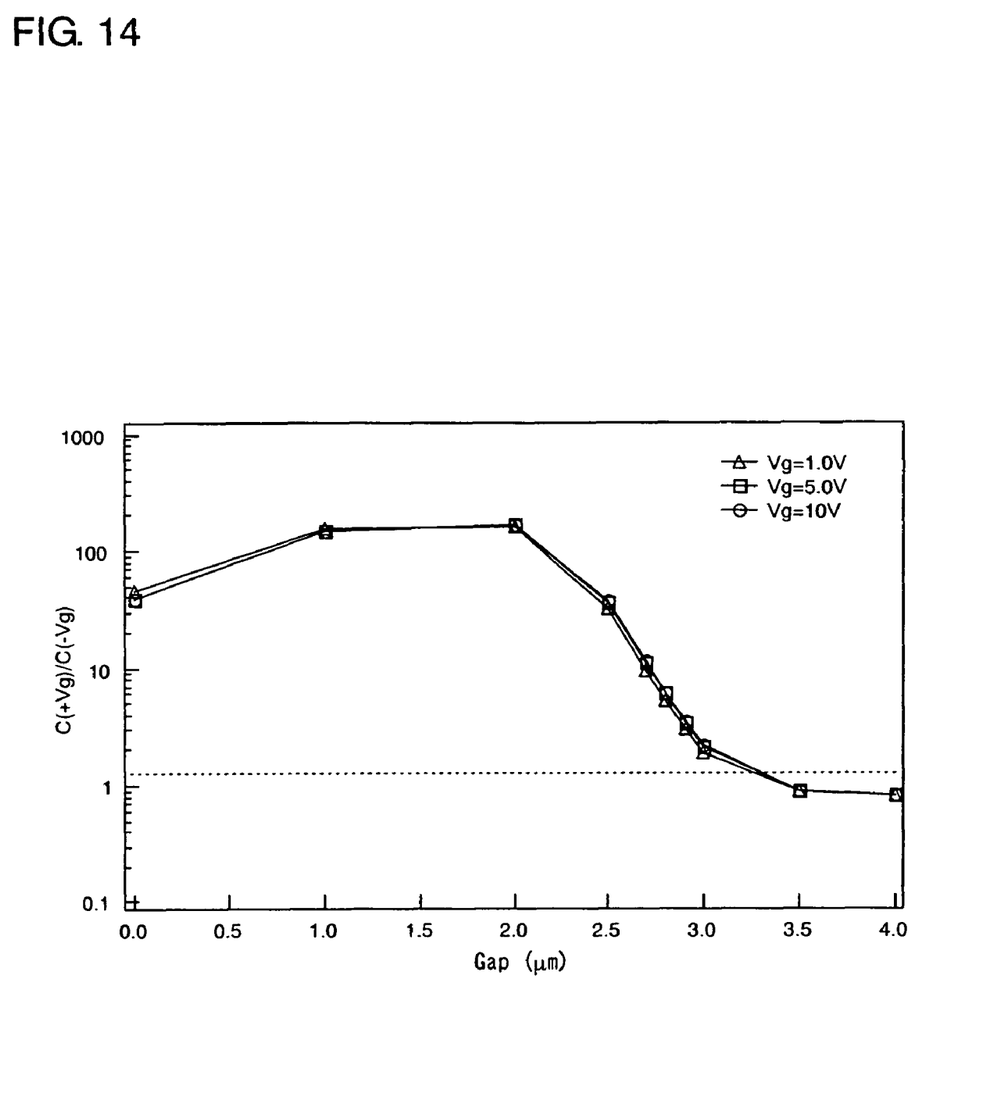
FIG. 14 is a graph showing the dependency of offset length (Gap) of a MOS capacitor according to the invention.

FIG. 14 shows a mutual relation between the offset length (Gap) of the n$^+$ contact MOS capacitor element and the capacitance ratio C(+Vg)/C(−Vg).

According to FIG. 14, when the offset length is less than 3.2 μm, the C(+Vg)/C(−Vg) is more than 1. This indicates that the n$^+$ contact MOS capacitor shows a CV curve of an n-type MOS capacitor. On the other hand, when the offset length is more than 3.2 μm, the C(+Vg)/C(−Vg) is less than 1. Therefore, it is known that this n$^+$ contact MOS capacitor shows a CV curve of a p-type MOS capacitor. When the offset length is equal to 3.2 μm, the C(+Vg)/C(−Vg) is equal to 1. This indicates that the CV curve shows a constant flat state even if the Vg is a positive value or a negative value.

As set forth above, it is known that this n$^+$ contact MOS capacitor shows a behavior of the n-type MOS capacitor in the case where the offset length is less than 3.2 μm and a behavior of the p-type MOS capacitor in the case where the offset length is more than 3.2 μm.

Therefore, the conductivity type (an n-type or a p-type) of a MOS capacitor can be changed by controlling the offset length without changing a conductivity type of an impurity or a concentration of the impurity.

Similarly, when the channel region is an n-type and the contact region is a p-type, the CV curve can be changed to the n-type from the p-type by setting the offset length to more than 0.

As a consequence, a MOS capacitor having various amounts of capacitance can be manufactured only by changing the offset length. Moreover, the positive and negative potentials can be held without changing the conductivity type of the MOS capacitor.

According to this embodiment, it is confirmed that the CV curve is inverted by changing the offset length (Gap), the length of the edge of the gate electrode to a boundary between a contact region and a channel formation region. For example, the positive and negative potentials can be held by utilizing this feature.

Embodiment 2

Differing from Embodiment 1, the impurity concentration dependency of the channel formation region of CV curves was measured by changing the concentration of an impurity with respect to the channel formation region while fixing the offset length (Gap).

The structure of a MOS capacitor used in this embodiment is same as that of Embodiment 1. The measurement results of the impurity concentration dependencies of the channel formation region in the CV curves are shown in FIG. 11.

Figure 11:
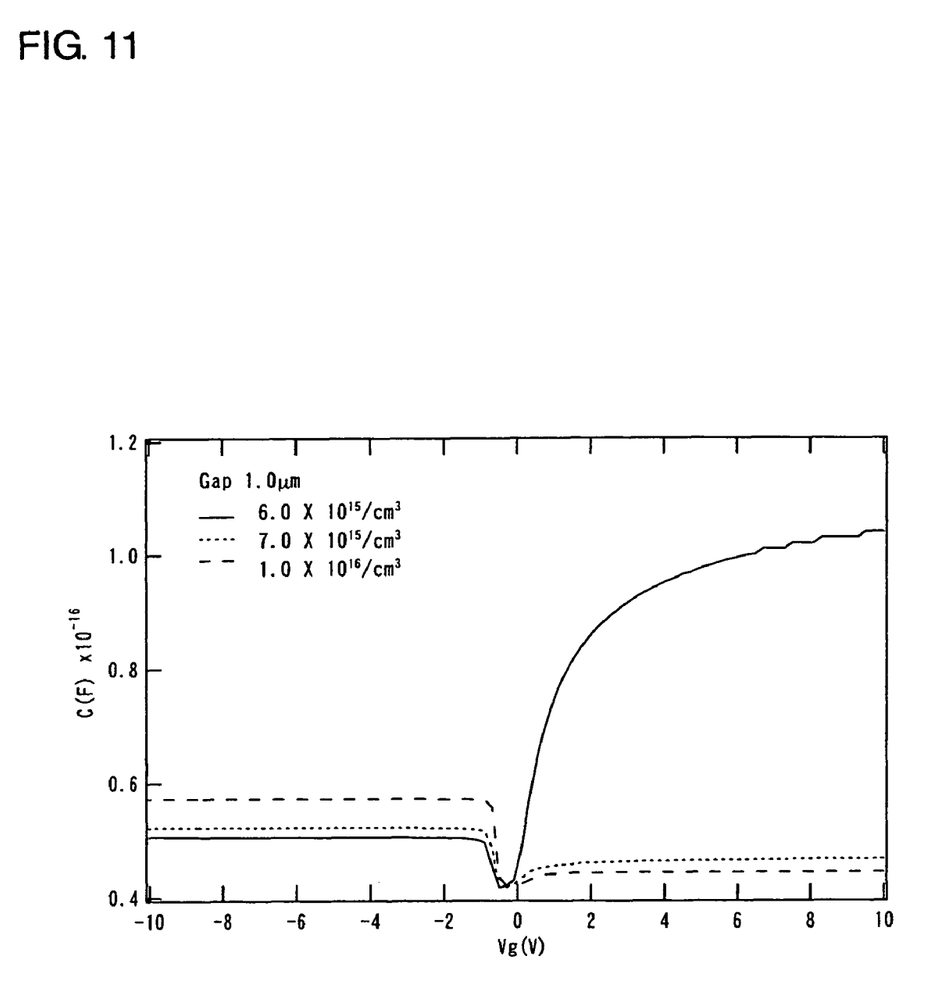
FIG. 11 is a graph showing the dependency of impurity concentration of channel formation region of a MOS capacitor according to the invention.

FIG. 11 shows a mutual relation between the capacitance of the MOS capacitor and the impurity concentrations of the channel formation region in the case where the offset length is fixed to 1.0 μm. The impurity concentrations are set to be $6\times10^{15}$ cm$^{-3}$, $7\times10^{15}$ cm$^{-3}$, and $1\times10^{16}$ cm$^{-3}$, respectively.

According to FIG. 11, it is known that the CV curves are changed to the p-type from the n-type at a certain level of the impurity concentration (at $7.0\times10^{15}$ cm$^{-3}$ in FIG. 11). This is because when the concentration of the impurity in the channel formation region is increased, the expansion of a depletion layer or an accumulation layer is reduced, and therefore, the depletion layer or the accumulation layer does not intrude into the contact region.

As a result, it is known that the CV curve can be changed to the p-type from the n-type by changing the impurity concentration in the channel formation region while fixing the offset length. Similarly, when the channel formation region is formed to have the n-type conductivity and the contact region is formed to have the p-type conductivity, the CV curve can be changed to the n-type from the p-type by increasing the impurity concentration (donor density) in the channel formation region.

Embodiment 3

A MOS capacitor having a different structure from those of the MOS capacitors as shown in Embodiments 1 and 2 will be described in this embodiment with reference to FIG. 12.

Figure 12:
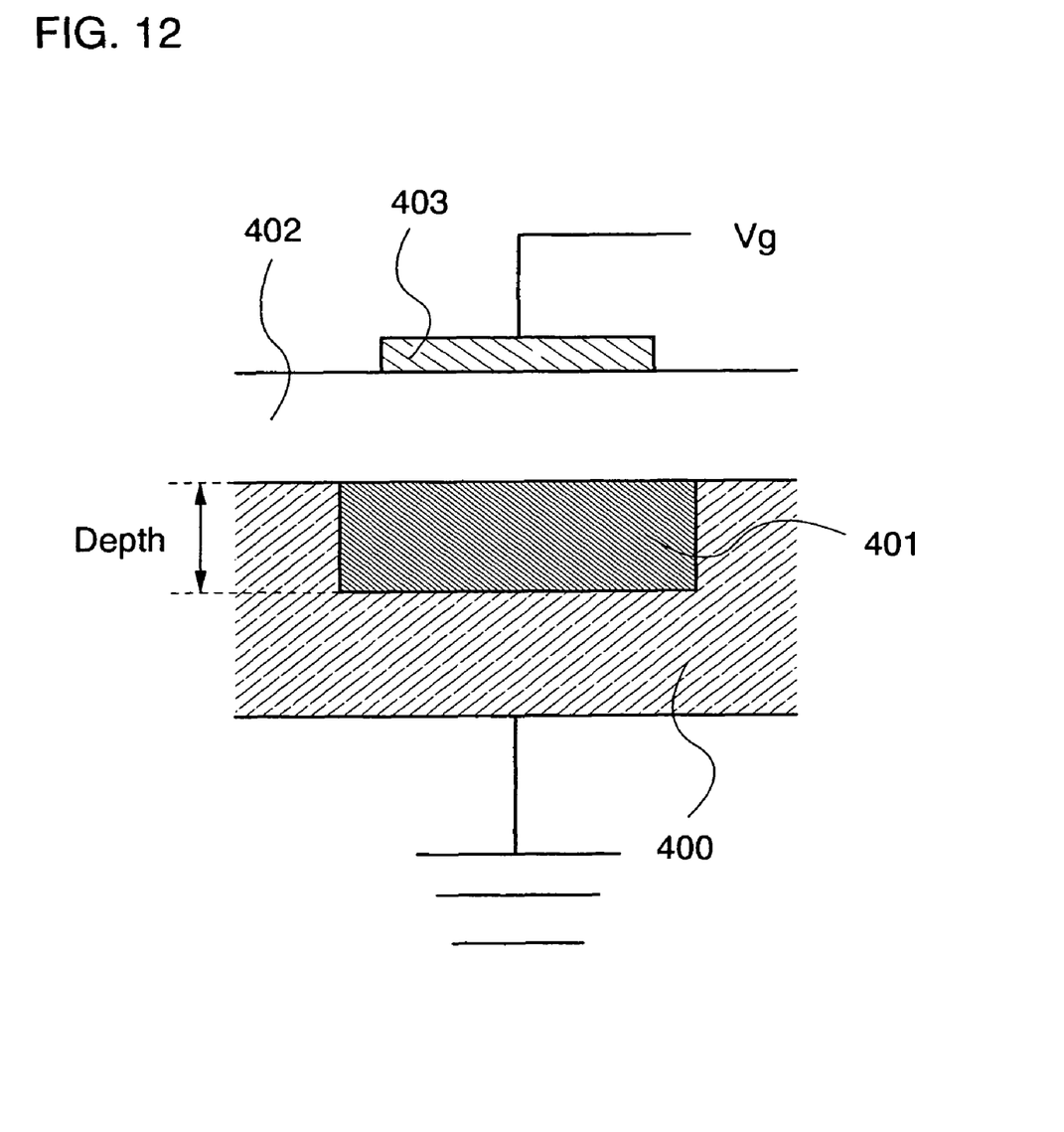
FIG. 12 is a diagram showing a MOS capacitor according to the invention.

In FIG. 12, reference numeral 400 indicates a p-type semiconductor substrate; 401, an n-type well in the p-type semiconductor substrate 400; 402, a gate insulating film; and 403, a gate electrode.

The phenomenon of inverting a CV curve can also be obtained according to this embodiment by forming an n-type region (the n-type well) in the p-type semiconductor substrate as shown in FIG. 12, together with the two-dimensional structure as shown in FIG. 7. In this case, the offset length (Gap) of FIG. 7 corresponds to the depth of the n-type well 401 in FIG. 12.

In this embodiment, when the depth of the n-type well 401 is increased and a depletion layer and an accumulation layer are provided inside of the n-type well 401, a CV curve of the n-type is shown.

On the other hand, when the depth of the n-type well 401 is reduced such that an electric field due to the gate voltage intrudes into the semiconductor substrate, a CV curve of the p-type is shown.

Also, the same effect can be obtained by changing the concentration of the impurity (dopant density) injected in the n-type well 401 as well as Embodiment 2.

Of course, the similar effect can be obtained when using the p-type well, though the example of the n-type well is shown in this embodiment.

The MOS capacitor of the present embodiment is applicable to a memory element, e.g., a semiconductor device including a MOS memory and a memory element.

Embodiment 4

An example of a MOS capacitor having a different structure of that of Embodiment 1 will be described in the present embodiment with reference to FIG. 13.

Figure 13:
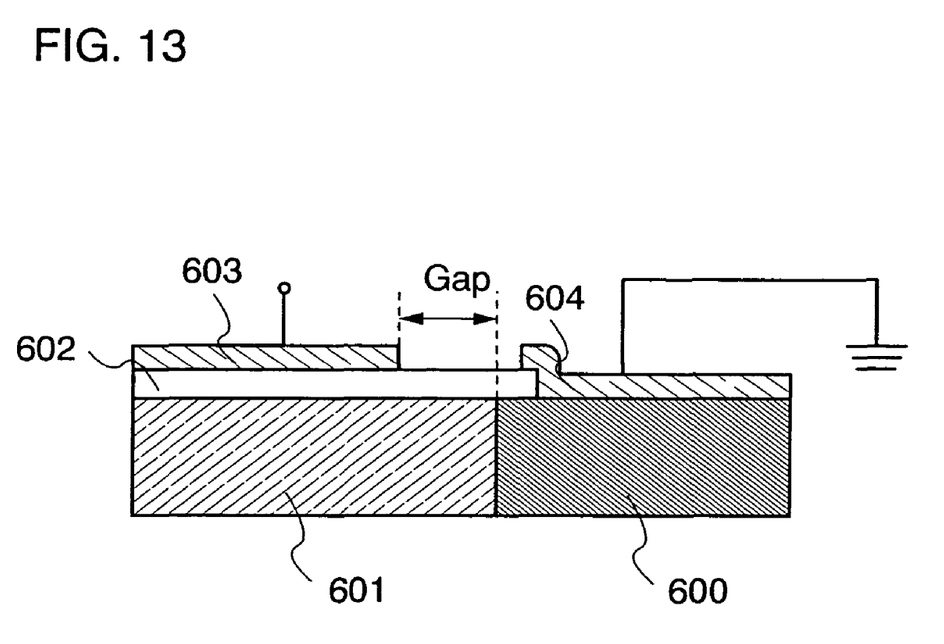
FIG. 13 is a diagram showing a MOS capacitor according to the invention.

In FIG. 13, reference numeral 600 denotes an impurity region (a contact region); 601, a channel formation region; 602, a gate insulating film; 603, a gate electrode; and 604, a contact electrode.

Differing from FIG. 7, the gate insulating film 602 is also formed on a part of the contact region 600 in FIG. 13.

The overall capacitance of the MOS capacitor of FIG. 13 corresponds to the combined capacitance of the capacitance of the gate insulating film, the capacitance of a depletion layer formed in the channel formation region and the capacitance of the junction formed between the channel formation region 601 and the contact region 604.

With respect to the MOS capacitor as shown in FIG. 13, by changing the offset length, and by changing the impurity concentration of the channel formation region 601, an upward-sloping CV curve can be changed to a downward-sloping CV curve or a downward-sloping CV curve can be changed to an upward-sloping CV curve. That is, the polarity of the CV curve can be changed.

The MOS capacitor of the present embodiment can be applied to a memory element, e.g., a semiconductor device including a MOS memory or a memory element.

According to the present invention, the capacitance of a MOS capacitor can be changed only by changing the offset length without changing to a kind of an impurity (a donor or an acceptor) in a channel formation region. In addition, an n-type MOS capacitor and a p-type MOS capacitor can be formed over a same substrate only by changing the offset length. As a result, positive and negative potentials can be held in a panel that is formed using either an n-type MOS capacitor or a p-type MOS capacitor.

What is claimed is:

1. A semiconductor device comprising:
a memory element including a capacitor element,
wherein the capacitor element includes:
a semiconductor layer including a first region and a second region;
a conductive layer over the semiconductor layer with a insulating film interposed between the conductive layer and the semiconductor layer; and
an electrode over the second region,
wherein the electrode is substantially in contact with the whole of a top surface of the second region,
wherein a concentration of an impurity in the second region is higher than that in the first region, and
wherein a gap exists between an edge of the conductive layer and a boundary of the first region and the second region, and
wherein a length of the gap is more than or equal to 3.2 μm.

2. The semiconductor device according to claim 1, wherein the first region has an opposite conductivity type to that of the second region.

3. The semiconductor device according to claim 1, wherein the first region has a same conductivity type as that of the second region.

4. A semiconductor device comprising:
a memory element including a plurality of capacitor elements, wherein each of the plurality of capacitor elements includes:
a semiconductor layer including a first region and a second region;
a conductive layer over the semiconductor layer with a insulating film interposed between the conductive layer and the semiconductor layer; and
an electrode over the second region,
wherein the electrode is substantially in contact with the whole of a top surface of the second region,
wherein a concentration of an impurity in the second region is higher than that in the first region,
wherein a gap exists between an edge of the conductive layer and a boundary of the first region and the second region, and a length of the gap is different in each of the plurality of capacitor elements, and
wherein a length of the gap of one of the plurality of capacitor elements is more than or equal to 3.2 μm.

5. The semiconductor device according to claim 4, wherein the first region has an opposite conductivity type to that of the second region.

6. The semiconductor device according to claim 4, wherein the first region has a same conductivity type as that of the second region.

7. A semiconductor device comprising:
a memory element, including a plurality of capacitor elements, wherein each of the plurality of capacitor elements includes:
a semiconductor layer including a first region and a second region;
a conductive layer over the semiconductor layer with a insulating film interposed between the conductive layer and the semiconductor layer; and
an electrode over the second region,
wherein the electrode is substantially in contact with the whole of a top surface of the second region,
wherein a concentration of an impurity in the second region is higher than that in the first region,
wherein a gap exists between an edge of the conductive layer and a boundary of the first region and the second region, and a length of the gap is different in each of the plurality of capacitor elements,
wherein at least one of the plurality of capacitor elements is characterized to be an N-type MOS capacitor by a length of the gap and at least one of the plurality of capacitor elements is characterized to be a P-type MOS capacitor by a length of the gap, and
wherein a length of the gap of one of the plurality of capacitor elements is more than or equal to 3.2 μm.

8. The semiconductor device according to claim 7, wherein the first region has an opposite conductivity type to that of the second region.

9. The semiconductor device according to claim 7, wherein the first region has a same conductivity type as that of the second region.

10. A semiconductor device comprising:
a memory element including at least a first capacitor and a second capacitor,
wherein each of the first capacitor and the second capacitor includes:
a semiconductor layer including a first region and a second region;
a conductive layer over the semiconductor layer with a insulating film interposed between the conductive layer and the semiconductor layer; and
an electrode over the second region,
wherein the electrode is substantially in contact with the whole of a top surface of the second region,
wherein a concentration of an impurity in the second region is higher than that in the first region,
wherein a gap exists between an edge of the conductive layer and a boundary of the first region and the second region,
wherein a concentration of an impurity in the first region of the first capacitor is different from that of the second capacitor, and
wherein a length of the gap of the first capacitor is more than or equal to 3.2 μm.

11. The semiconductor device according to claim 10, wherein the first region has an opposite conductivity type to that of the second region.

12. The semiconductor device according to claim 10, wherein the first region has a same conductivity type as that of the second region.

13. A semiconductor device comprising:
a memory element including a capacitor element,
wherein the capacitor element includes:
a semiconductor layer including a first region and a second region;
a conductive layer over the first region with a insulating film interposed between the conductive layer and the first region; and an electrode over the second region, wherein the electrode is substantially in contact with the whole of a top surface of the second region, wherein a concentration of an impurity in the second region is higher than that in the first region, wherein a gap exists between an edge of the conductive layer and a boundary of the first region and the second region, and wherein a length of the gap is more than or equal to 3.2 µm.

14. The semiconductor device according to claim 13, wherein the first region has an opposite conductivity type to that of the second region.

15. The semiconductor device according to claim 13, wherein the first region has a same conductivity type as that of the second region.

16. A semiconductor device including comprising:

a memory element including a plurality of capacitor elements, wherein each of the plurality of capacitor elements includes:

a semiconductor layer including a first region and a second region;

a conductive layer over the first region with a insulating film interposed between the conductive layer and the first region; and an electrode over the second region, wherein the electrode is substantially in contact with the whole of a top surface of the second region, wherein a concentration of an impurity in the second region is higher than that in the first region, wherein a gap exists between an edge of the conductive layer and a boundary of the first region and the second region, and a length of the gap is different in each of the plurality of capacitor elements, and wherein a length of the gap of one of the plurality of capacitor elements is more than or equal to 3.2 µm.

17. The semiconductor device according to claim 16, wherein the first region has an opposite conductivity type to that of the second region.

18. The semiconductor device according to claim 16, wherein the first region has a same conductivity type as that of the second region.

19. A semiconductor device comprising:

a memory element including a plurality of capacitor elements, wherein each of the plurality of capacitor elements includes:

a semiconductor layer including a first region and a second region;

a conductive layer over the first region with a insulating film interposed between the conductive layer and the first region, an electrode over the second region; and wherein the electrode is substantially in contact with the whole of a top surface of the second region, wherein a concentration of an impurity in the second region is higher than that in the first region, wherein a gap exists between an edge of the conductive layer and a boundary of the first region and the second region, and a length of the gap is different in each of the plurality of capacitor elements, wherein at least one of the plurality of capacitor elements is characterized to be an N-type MOS capacitor by a length of the gap and at least one of the plurality of capacitor elements is characterized to be a P-type MOS capacitor by a length of the gap, and wherein a length of the gap of one of the plurality of capacitor elements is more than or equal to 3.2 µm.

20. The semiconductor device according to claim 19, wherein the first region has an opposite conductivity type to that of the second region.

21. The semiconductor device according to claim 19, wherein the first region has a same conductivity type as that of the second region.

22. A semiconductor device comprising:

a memory element including at least a first capacitor and a second capacitor, wherein each of the first capacitor and the second capacitor includes:

a semiconductor layer including a first region and a second region;

a conductive layer over the first region with a insulating film interposed between the conductive layer and the first region; and an electrode over the second region, wherein the electrode is substantially in contact with the whole of a top surface of the second region, wherein a concentration of an impurity in the second region is higher than that in the first region, wherein a gap exists between an edge of the conductive layer and a boundary of the first region and the second region, wherein a concentration of an impurity in the first region of the first capacitor is different from that of the second capacitor, and wherein a length of the gap of the first capacitor is more than or equal to 3.2 µm.

23. The semiconductor device according to claim 22, wherein the first region has an opposite conductivity type to that of the second region.

* * * * *